United States Patent
Ebe et al.

[11] Patent Number: 5,356,684
[45] Date of Patent: Oct. 18, 1994

[54] OPTICAL RECORDING MEDIUM AND METHOD OF MANUFACTURING THEREOF

[75] Inventors: Masaomi Ebe; Masataka Uchidoi; Yoshihiko Iwama; Hiroshi Sato; Yoshitaka Nonaka, all of Yamanashi, Japan

[73] Assignees: Pioneer Electronic Corporation, Tokyo; Pioneer Video Corporation, Yamanashi, both of Japan

[21] Appl. No.: 922,477

[22] Filed: Jul. 31, 1992

[30] Foreign Application Priority Data

Mar. 13, 1992 [JP] Japan ................. 4-055277

[51] Int. Cl.⁵ ............................................. B32R 3/00
[52] U.S. Cl. ....................................... 428/64; 428/65; 428/457; 428/913; 430/945; 346/76 L; 346/135.1
[58] Field of Search .................... 428/64, 65, 457, 913; 430/945; 346/76 L, 135.1

[56] References Cited

U.S. PATENT DOCUMENTS

| | | | |
|---|---|---|---|
| 4,658,392 | 4/1987 | Langowski et al. | 369/288 |
| 4,709,363 | 11/1987 | Dirks et al. | 369/275 |
| 4,950,520 | 8/1990 | Imai et al. | 428/64 |
| 5,039,558 | 8/1991 | Imai et al. | 427/162 |
| 5,075,145 | 12/1991 | Yamamoto | 428/65 |

FOREIGN PATENT DOCUMENTS

449539 2/1992 Japan.

Primary Examiner—Patrick J. Ryan
Assistant Examiner—Elizabeth Evans
Attorney, Agent, or Firm—Sughrue, Mion, Zinn, Macpeak & Seas

[57] ABSTRACT

The object of the present invention is to provide a an optical recording medium provided with a reflective film having a high reflectivity and durability and a means for producing thereof, and it can be obtained by a method comprising the steps of: first placing on a heating object an aluminum metal alloy containing at least one of 0.05–0.2 wt.% metal selected from the group of iron, copper and silicon, and also having 0.7–3.0 wt.% manganese; and evaporating the aluminum metal alloy in a vacuum by means of a vapor deposition process to an information signal recorded surface of a transparent synthetic resin plate. In other words, an optical recording medium according to the present invention is provided with a light reflective film covering an information signal recorded surface of a transparent synthetic resin plate, wherein the light reflective film is formed in a vacuum by means of a vapor deposition process of an aluminum metal alloy containing at least one of 0.05–0.2 wt.% metal selected from a group of iron, copper and silicon, and also containing 0.7–3.0 wt.% manganese.

2 Claims, 1 Drawing Sheet

TABLE 1

| RECORDING MEDIUM | COMPOSITION OF REFLECTIVE FILM | | | | | PICTURE QUALITY CHECK | | | SURFACE QUALITY CHECK | STABILITY OF REFLECTIVE FILM | LIGHT REFLECTION (%) |
|---|---|---|---|---|---|---|---|---|---|---|---|
| | Al | Fe | Cu | Si | Mn | FIRST | SECOND | THIRD | | | |
| A* | 100 | - | - | - | - | ○ | △ | × | × | × | 80~86 |
| B* | 99.0 | 1.00 | - | - | - | ○ | ○ | ○ | × | × | 78~84 |
| C* | 99.1 | - | 0.89 | - | - | ○ | ○ | ○ | × | △ | 76~83 |
| D* | 99.8 | - | - | 1.16 | - | ○ | ○ | × | × | × | 79~83 |
| E* | 99.0 | - | - | - | 0.95 | ○ | ○ | ○ | × | △ | 76~82 |
| F | 98.7 | 0.07 | - | - | 1.25 | ○ | ○ | ○ | ○ | ○ | 75~82 |
| G | 98.7 | - | 0.07 | - | 1.25 | ○ | ○ | ○ | ○ | ○ | 75~82 |
| H | 98.7 | - | - | 0.07 | 1.25 | ○ | ○ | ○ | ○ | ○ | 75~82 |
| I* | 98.0 | 0.7 | - | - | 1.3 | ○ | ○ | ○ | × | × | 72~80 |
| J* | 98.0 | - | 0.7 | - | 1.3 | ○ | ○ | ○ | × | × | 72~80 |
| K* | 98.0 | - | - | 0.7 | 1.3 | ○ | ○ | × | × | × | 73~80 |

*: FOR COMPARISON

TABLE 1

| RECORDING MEDIUM | COMPOSITION OF REFLECTIVE FILM | | | | | PICTURE QUALITY CHECK | | | SURFACE QUALITY CHECK | STABILITY OF REFLECTIVE FILM | LIGHT REFLECTION (%) |
|---|---|---|---|---|---|---|---|---|---|---|---|
| | Al | Fe | Cu | Si | Mn | FIRST | SECOND | THIRD | | | |
| A* | 100 | — | — | — | — | ○ | △ | × | × | × | 80~86 |
| B* | 99.0 | 1.00 | — | — | — | ○ | ○ | ○ | × | × | 78~84 |
| C* | 99.1 | — | 0.89 | — | — | ○ | ○ | ○ | × | △ | 76~83 |
| D* | 99.8 | — | — | 1.16 | — | ○ | ○ | × | × | × | 79~83 |
| E* | 99.0 | — | — | — | 0.95 | ○ | ○ | ○ | × | △ | 76~82 |
| F | 98.7 | 0.07 | — | — | 1.25 | ○ | ○ | ○ | ○ | ○ | 75~82 |
| G | 98.7 | — | 0.07 | — | 1.25 | ○ | ○ | ○ | ○ | ○ | 75~82 |
| H | 98.7 | — | — | 0.07 | 1.25 | ○ | ○ | ○ | ○ | ○ | 75~82 |
| I* | 98.0 | 0.7 | — | — | 1.3 | ○ | ○ | ○ | × | × | 72~80 |
| J* | 98.0 | — | 0.7 | — | 1.3 | ○ | ○ | ○ | × | × | 72~80 |
| K* | 98.0 | — | — | 0.7 | 1.3 | ○ | ○ | × | × | × | 73~80 |

* : FOR COMPARISON

OPTICAL RECORDING MEDIUM AND METHOD OF MANUFACTURING THEREOF

BACKGROUND OF THE INVENTION

1. Field of the Invention

The present invention relates to an optical recording medium wherein information signals recorded on the disk surface thereof are optically read out, and specifically relates to an optical recording medium such as a video disk, a compact disk and so forth.

2. Description of the Prior Art

A conventionally adopted optical recording medium such as an optical video disk, a compact disk or the like has been constructed such that an information signal recorded surface which is provided on a transparent synthetic resin plate and formed with a plurality of information signal pits is covered by a light reflective film, wherein the information signals are reproduced by scanning the recorded surface of the synthetic resin plate by a photo detector so as to detect the existence and size of the information signal pits in accordance with a variation of the magnitude of the lights reflected therefrom.

It has been one of the most important factors in the conventional type optical recording medium constructed as above to form a light reflective film with a material of high reflectivity, and in many cases aluminum having high-degree of purity has been applied by a vapor deposition. However, the reflective film made of this aluminum with high-degree of purity is not substantially stable, and thus it has been likely to be deteriorated even by oxygen, water moisture and so on in the air, and the film surface is peeled off to thereby cause a blister, pin holes and so forth, resulting that erroneous fault in reading information signals is increased. For this reason, a protection coating layer or the like has been applied to the rear surface side of the light reflective film to prevent the reflective film from deteriorating by oxidation, but it was not substantially effective to perfectly protect it from the deterioration due to an exfoliation or the like.

There have been proposed various methods to improve the peeling phenomenon of the light reflective film so far, a case in point being the one disclosed in Japanese Patent Application Laid Open No. 57-186244, wherein it is proposed to form a film layer through an evaporation or a spattering of a metal alloy of specific components.

In this method, it is disclosed that a light reflective film having a high durability can be obtained by an evaporation or a spattering of a metal alloy which is selected from the group consisting of an Al—Cr alloy having more than 75 at.% aluminum, an Al—Cu alloy having more than 40 at.% aluminum, an Al—B alloy having more than 70 at.% aluminum, an Al—Mn alloy having at least 75 at.% aluminum, and an Al—lanthanide alloy having 0.1 to 3.0 at.% of the lanthanide, wherein each of these metal alloys comprises at least 1 at.% of the composing elements, with the exception of the Al—lanthanide alloy. However, an optimum durability cannot be obtained if an enough quantity of the second composing element is not contained in the metal alloys, and on the other hand, if a quantity of the second composing element therein becomes too much, the reflectivity thereof is also lowered, so that it has been a difficult problem to obtain a reflective film with a high durability, yet with a high reflectivity altogether.

It is also widely known that a reflective film which is not easily offended by a peeling phenomenon or the like can be obtained if the evaporation of an aluminum or an aluminum metal alloy onto the signal recorded surface is performed at a speed not higher than 1.5 nanometers per second as disclosed in Japanese Patent Publication No. 3-79775. However, since the film layer forming speed is so low in this method, it is difficult to raise the productivity thereof, and to control a stability of the evaporating speed, and also there is a problem that even when a reflective film with high reflectivity is obtained, the durability thereof is not stable due to a possible variation of the evaporating speed.

SUMMARY OF THE INVENTION

The present invention has been made to eliminate such problems as disclosed above, and it is an object of the present invention to provide a means for producing an optical recording medium provided with a reflective film having a high reflectivity and durability.

The above object of the present invention can be achieved by a method comprising the steps of: first placing on a heating object an aluminum metal alloy containing at least one of 0.05–0.2 wt.% metal selected from the group of iron, copper and silicon, and also having 0.7–3.0 wt.% manganese; and evaporating the aluminum metal alloy in a vacuum by means of a vapor deposition process to an information signal recorded surface of a transparent synthetic resin plate. In other words, an optical recording medium according to the present invention is characterized in that it is provided with a light reflective film covering an information signal recorded surface of a transparent synthetic resin plate, wherein the light reflective film is formed in a vacuum by means of a vapor deposition process of an aluminum metal alloy containing at least one of 0.05–0.2 wt.% metal selected from a group of iron, copper and silicon, and also containing 0.7–3.0 wt.% manganese.

A synthetic resin plate used for an optical recording medium according to the present invention can be selected from a transparent synthetic resin such as a methacrylate resin, polycarbonate resin, and a polyolefine resin and so on and preferably formed in a circular form, but the material and a shape thereof is not limited as such.

The light reflective film formed on an information signal recording surface of the above synthetic resin plate is constructed such that an aluminum metal alloy containing therein at least one of 0.05–0.2 wt.% metal selected from the group of iron, copper and silicon, and also containing 0.7–3.0 wt.% of manganese is evaporated in a vacuum to the information signal recorded surface, wherein in case the quantity of any of the selected one of iron, copper and a silicon is not enough, the durability thereof will not be enough, and in case any one of them is contained too much, a possibility of deterioration will also be raised. Further, if the quantity of manganese contained therein is not enough, prevention of deterioration will not be efficient, and if it is contained too much, then the reflectivity thereof will be considerably lowered, which is not a desirable phenomenon either.

As a method of vacuum deposition for depositing the aluminum metal alloy, a conventionally adopted vacuum deposition can be utilized, wherein the vapor depositing speed can be normally 1–30 nm/sec, and the thickness of the light reflective film can be 40–100 nm or the like.

The optical recording medium according to the present invention is provided with a reflective film having a high reflectivity, and further, even if the vapor depositing speed during the evaporation is varied, a product with a high degree of anti-deterioration can be constantly obtained.

Other objects and features of the invention will be more fully understood from the following detailed description and appended claims when taken with the accompanying drawing.

BRIEF DESCRIPTION OF THE DRAWING

Table. 1 shows the reflectivity and stability of each of the optical reflective media A to K whose components are different from one another as the results of the picture and quality checks, wherein these checks are performed after the execution of artificial deterioration tests of the respective reflective media.

DETAILED DESCRIPTION OF THE PREFERRED EMBODIMENTS

On a circular methacrylate resin plate of 30 cm diameter having the surface thereof formed with information signal pits, aluminum or aluminum metal alloys of a constitution disclosed in Table 1 are evaporated to form a reflective film of 50–60 nm thick under the condition that the initial degree of vacuum is $2 \times 10^{-4}$ Torr and an average vapor depositing speed is selected to 6 nm/sec, whereby optical recording media A–K are produced.

Each of these optical recording media is first placed in the environment of the humidity 60% RH and temperature 60° C. for 48 hours to perform deterioration accelerating test and then a first picture quality check is executed. Thereafter, each recording medium is placed in the environment of the humidity 60% RH and temperature 70° C. for 48 hours to perform another deterioration accelerating test and then a second picture quality check is executed. Further, after going through another deterioration accelerating test in the environment of the humidity 60% RH and temperature 70° C. for 48 hours, a third picture quality check and a surface check by an optical microscope are executed. After all these inspections, the reflectivity of the mirror surface portion of each recording medium is measured, and the results thereof are disclosed in Table 1.

It is to be noted that the picture quality check is executed, when signals of the optical recording medium are reproduced in a dark room and the reproduced signal image is displayed on a CRT, by visibly observing the occurrence of light beam points which are displayed as a noise, wherein if the number of the light beam points indicating the deterioration is substantially small, the test result is regarded as being successful and marked as ○, if substantial number thereof is admitted, it is marked as Δ, and if numerous beam points are observed, then it is marked as X.

It should be also noted that the surface check through an optical microscope is performed by visibly observing the mirror surface portions of inner and outer periphery of each of the optical recording media in a dark room with 100 magnifications, and the results thereof are disclosed such that if the number of the light beam points indicating the deterioration is substantially small, the test result is regarded as being successful and marked as ○, if substantial number thereof is admitted, it is marked as Δ, and if numerous beam points are observed, then it is marked as X.

Observing the result shown in the table, it is understood that the optical recording medium according to the present invention maintains a constant superior reflectivity, and a substantially good anti-deterioration effect.

EFFECT OF THE INVENTION

An optical recording medium of the present invention comprises an optical reflective film having a high reflectivity and yet good anti-deterioration effect, and according to a method of manufacturing the optical recording medium, even when an evaporating speed is high, the quality thereof is substantially good to form a constant optical reflective film, so that high-quality of optical recording medium can be produced with high efficiency.

Having now fully described the invention, it will be apparent to one of ordinary skill in the art that many changes and modifications can be made thereto without departing from the spirit and scope of the invention as set forth herein.

What is claimed is:

1. An optical recording medium which is provided with a light reflective film covering an information signal recorded surface of a transparent synthetic resin plate, wherein said light reflective film is a deposited layer formed by a vacuum deposition of an aluminum metal alloy containing 0.05–0.2 wt.% of at least one metal selected from the group of iron, copper and silicon, and also containing 0.7–3.0 wt.% of manganese.

2. A method of manufacturing an optical recording medium comprising the steps of: placing on a heating object an aluminum metal alloy containing 0.05–0.2 wt.% of at least one metal selected from the group of iron, copper and silicon, and also containing 0.7–3.0 wt.% of manganese; and evaporating said aluminum metal alloy in a vacuum by means of a vapor deposition process to an information signal recorded surface of a transparent synthetic resin plate.

* * * * *